(12) United States Patent
Horiuchi

(10) Patent No.: US 11,600,585 B2
(45) Date of Patent: Mar. 7, 2023

(54) SEMICONDUCTOR DEVICE WITH METAL PLUGS AND METHOD FOR MANUFACTURING THE SAME

(71) Applicant: Kioxia Corporation, Tokyo (JP)

(72) Inventor: Mitsunari Horiuchi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 9 days.

(21) Appl. No.: 17/189,696

(22) Filed: Mar. 2, 2021

(65) Prior Publication Data

US 2022/0068858 A1 Mar. 3, 2022

(30) Foreign Application Priority Data

Aug. 31, 2020 (JP) .............................. JP2020-146057

(51) Int. Cl.
| | |
|---|---|
| *H01L 23/00* | (2006.01) |
| *H01L 25/065* | (2006.01) |
| *H01L 25/18* | (2006.01) |
| *H01L 23/535* | (2006.01) |
| *H01L 25/00* | (2006.01) |

(52) U.S. Cl.
CPC ............ *H01L 24/08* (2013.01); *H01L 23/535* (2013.01); *H01L 24/05* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ....... H01L 24/08; H01L 23/535; H01L 24/05; H01L 24/80; H01L 25/0657; H01L 25/18; H01L 25/50; H01L 2224/08145; H01L 2224/80895; H01L 2224/80896; H01L 2924/1431; H01L 2924/14511
See application file for complete search history.

(56) References Cited

U.S. PATENT DOCUMENTS

| | | | |
|---|---|---|---|
| 5,646,067 A | 7/1997 | Gaul | |
| 6,071,773 A * | 6/2000 | Lee | ................... H01L 27/10852 |
| | | | 257/E21.018 |
| 8,004,090 B2 | 8/2011 | Uchiyama | |

(Continued)

FOREIGN PATENT DOCUMENTS

| | | | | |
|---|---|---|---|---|
| CN | 111801799 A | * | 10/2020 | ............. H01L 24/08 |
| CN | 111801800 A | * | 10/2020 | ......... H01L 27/11524 |

(Continued)

*Primary Examiner* — Mamadou L Diallo
(74) *Attorney, Agent, or Firm* — Foley & Lardner LLP

(57) ABSTRACT

A semiconductor device includes a first substrate, a first insulating film provided on the first substrate, and a first plug provided in the first insulating film. The device further includes a first layer provided on the first insulating film and a first metal layer provided on the first plug in the first layer and electrically connected to the first plug. The device further includes a second metal layer including a first portion provided in the first layer and a second portion provided on the first layer and electrically connected to the first metal layer.

20 Claims, 15 Drawing Sheets

(56) References Cited

U.S. PATENT DOCUMENTS

| | | | | |
|---|---|---|---|---|
| 2010/0227461 | A1* | 9/2010 | Ochi | H01L 29/6659 |
| | | | | 438/585 |
| 2015/0262911 | A1 | 9/2015 | Chen et al. | |
| 2016/0284755 | A1* | 9/2016 | Shimotsusa | H01L 25/0657 |
| 2019/0326313 | A1* | 10/2019 | Cui | H01L 27/1157 |
| 2020/0144242 | A1* | 5/2020 | Park | H01L 27/11548 |
| 2020/0251149 | A1* | 8/2020 | Zhang | H01L 25/0657 |
| 2020/0258858 | A1 | 8/2020 | Shima | |
| 2020/0286842 | A1* | 9/2020 | Sanuki | H01L 24/09 |
| 2021/0057371 | A1* | 2/2021 | Park | H01L 24/32 |
| 2021/0066282 | A1* | 3/2021 | Kim | H01L 25/18 |
| 2021/0104615 | A1* | 4/2021 | Kim | H01L 21/76846 |
| 2021/0265314 | A1* | 8/2021 | Arai | H01L 23/5386 |
| 2021/0366825 | A1* | 11/2021 | Shin | H01L 23/5226 |
| 2021/0375914 | A1* | 12/2021 | Zhang | H01L 27/11526 |
| 2022/0020804 | A1* | 1/2022 | Kim | H01L 27/14623 |
| 2022/0068859 | A1* | 3/2022 | Choi | H01L 27/10805 |
| 2022/0102469 | A1* | 3/2022 | Arakawa | H01L 51/0096 |

FOREIGN PATENT DOCUMENTS

| | | | | |
|---|---|---|---|---|
| CN | 112041986 A | * | 12/2020 | H01L 23/562 |
| CN | 113192968 A | * | 7/2021 | H01L 27/1157 |
| JP | 2009-111061 A | | 5/2009 | |
| TW | 202030809 A | | 8/2019 | |
| TW | 202133369 A | * | 9/2021 | H01L 24/03 |

* cited by examiner

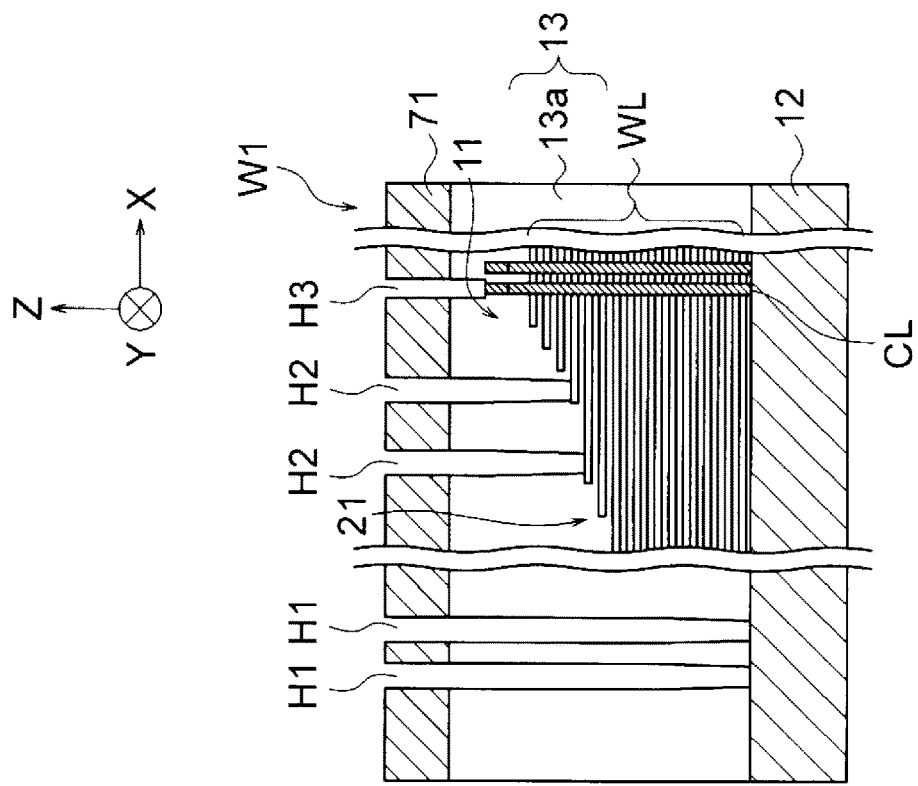
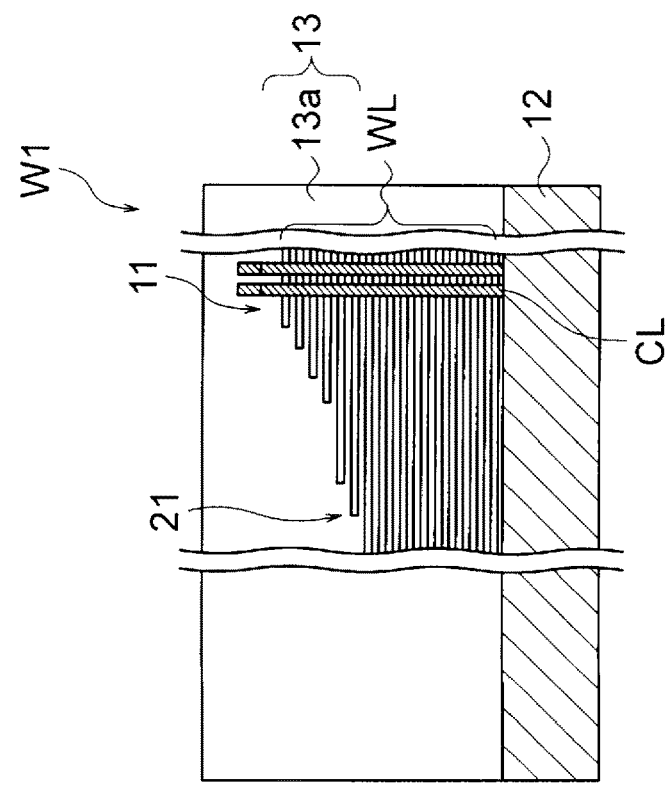

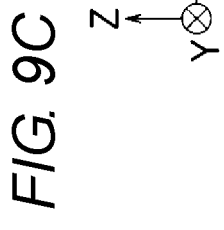
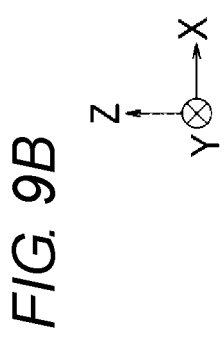
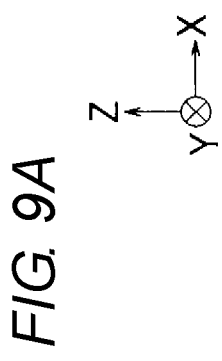
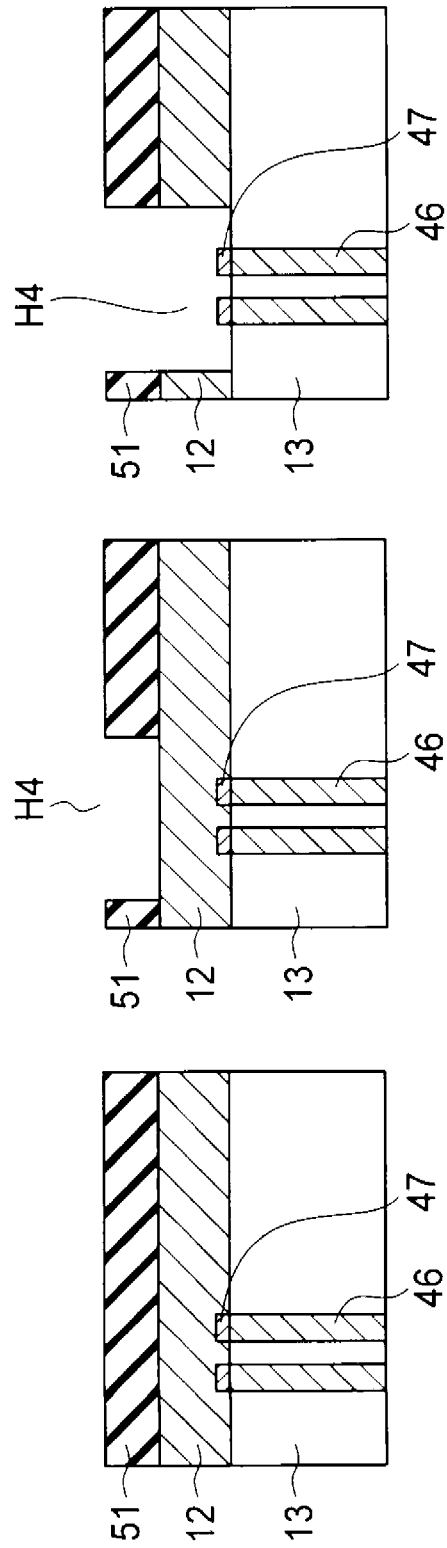

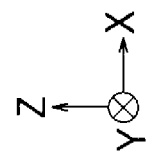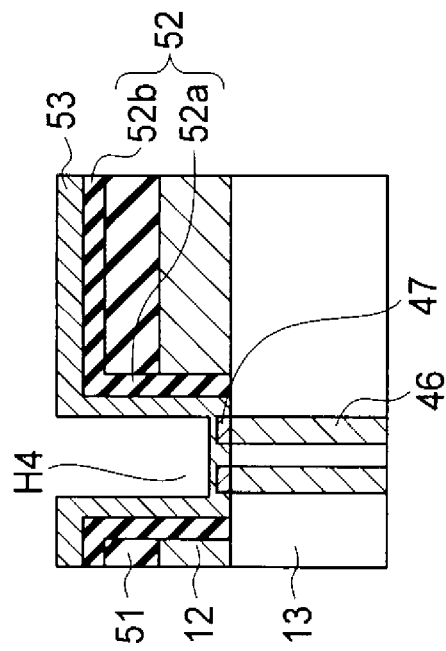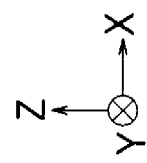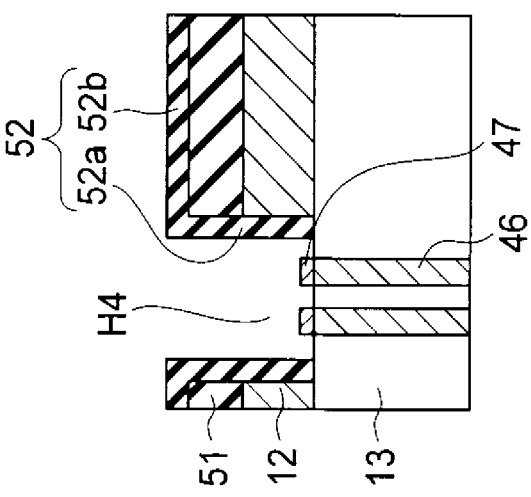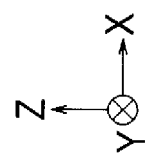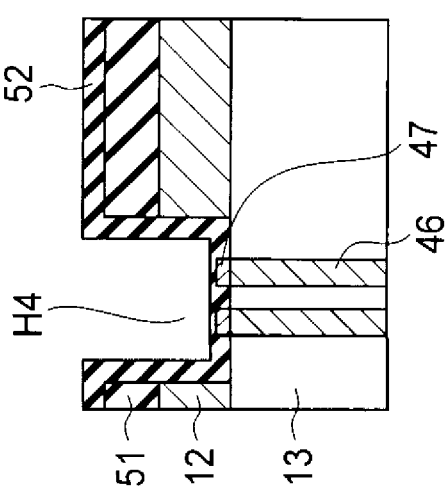
FIG. 10A  FIG. 10B  FIG. 10C

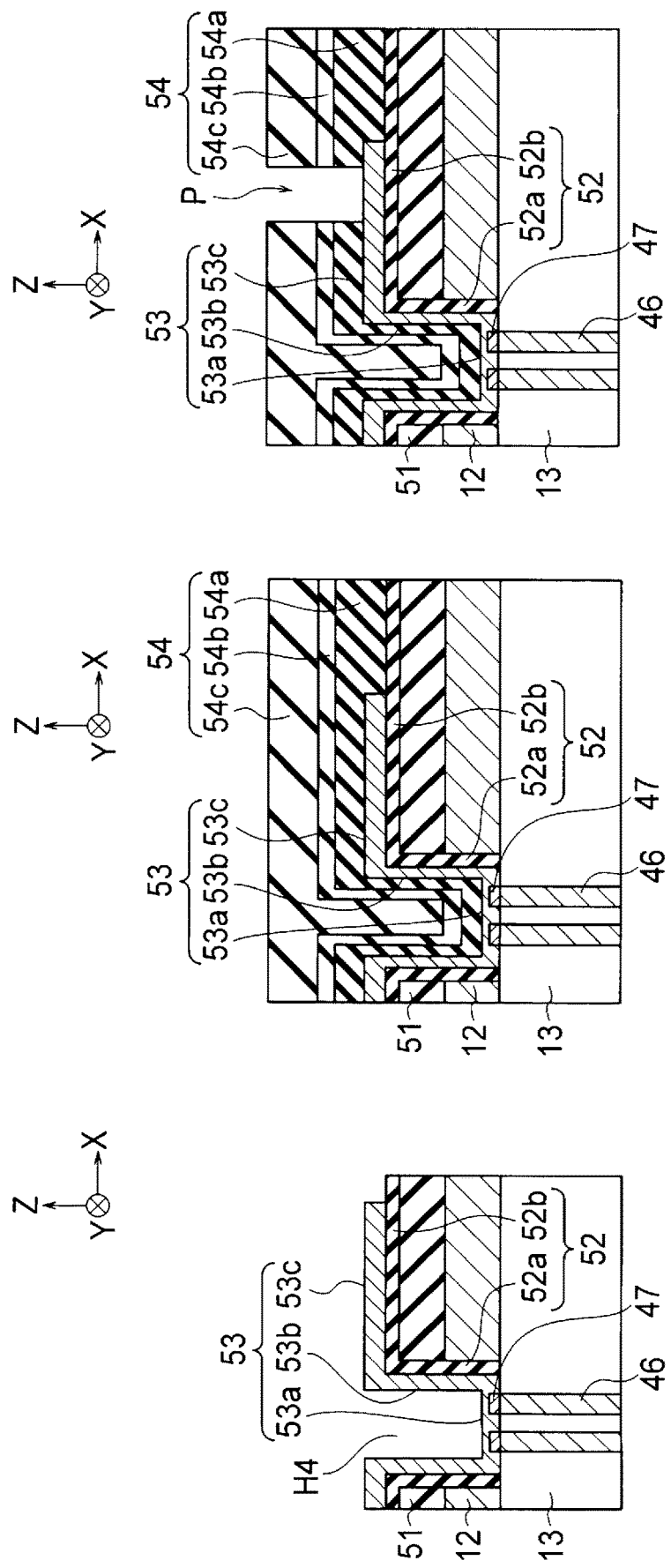

SEMICONDUCTOR DEVICE WITH METAL PLUGS AND METHOD FOR MANUFACTURING THE SAME

CROSS-REFERENCE TO RELATED APPLICATION

This application is based upon and claims the benefit of priority from Japanese Patent Application No. 2020-146057, filed on Aug. 31, 2020, the entire contents of which are incorporated herein by reference.

FIELD

Embodiments described herein relate generally to semiconductor devices and methods for manufacturing the same.

BACKGROUND

When an opening is formed in a layer on a plug and a metal layer is formed on the plug exposed in the opening, a problem arises that the plug is etched by etching for forming the opening.

DESCRIPTION OF THE DRAWINGS

FIGS. 4A and 4B are cross-sectional views (1/8) illustrating a method of manufacturing the semiconductor device;

FIGS. 9A to 9C are cross-sectional views (6/8) illustrating the method of manufacturing the semiconductor device;

FIGS. 10A to 10C are cross-sectional views (7/8) illustrating the method of manufacturing the semiconductor device;

FIGS. 11A to 11C are cross-sectional views (8/8) illustrating the method of manufacturing the semiconductor device;

DETAILED DESCRIPTION

Figure 1:
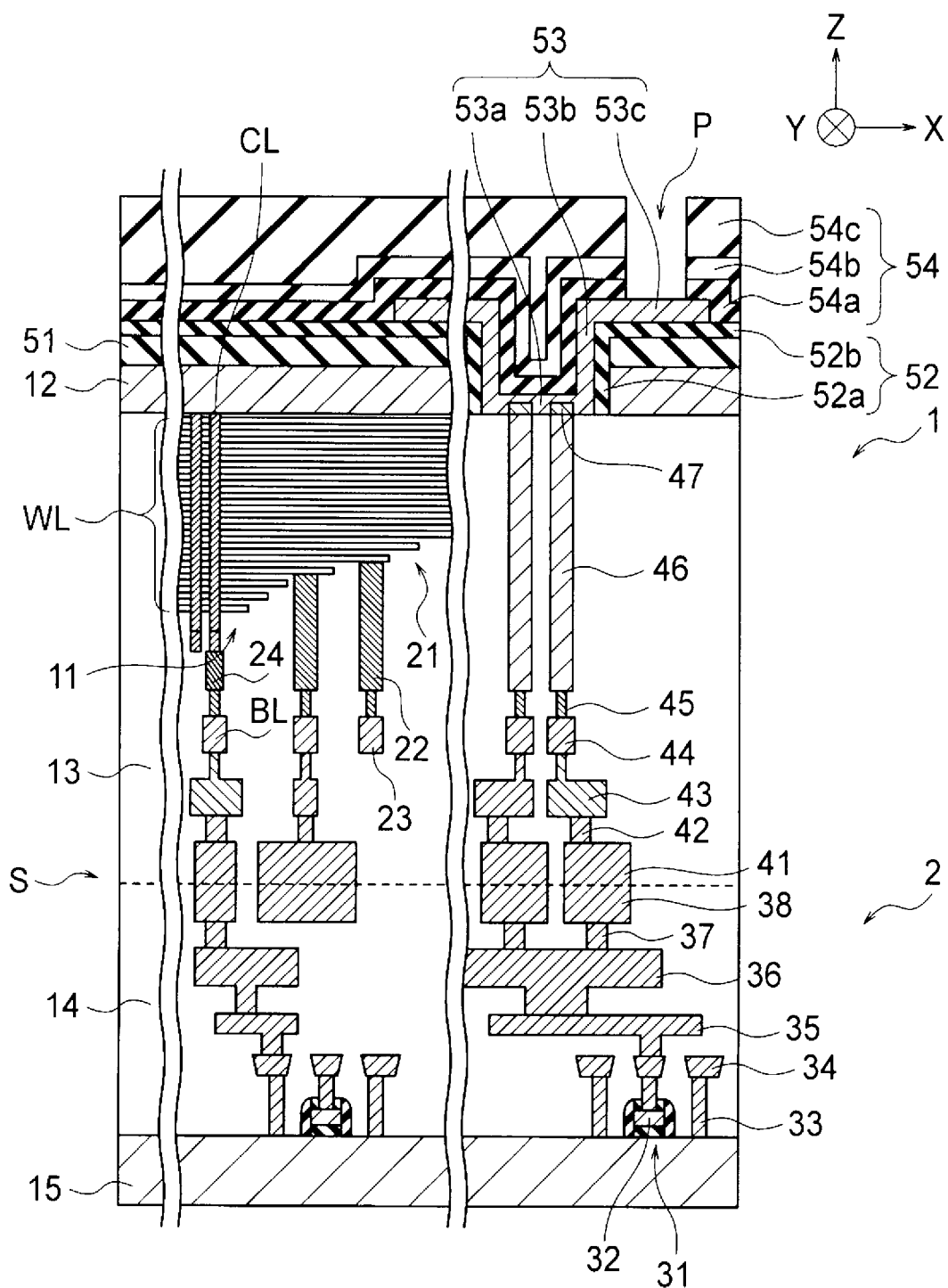
FIG. 1 is a cross-sectional view illustrating a structure of a semiconductor device according to a first embodiment.

At least one embodiment provides a semiconductor device capable of preferably forming a metal layer on a plug and a method for manufacturing the same.

In general, according to at least one one embodiment, there is provided a semiconductor device including a first substrate, a first insulating film provided on the first substrate, and a first plug provided in the first insulating film. The device further includes a first layer provided on the first insulating film and a first metal layer provided on the first plug in the first layer and electrically connected to the first plug. The device further includes a second metal layer including a first portion provided in the first layer and a second portion provided on the first layer and electrically connected to the first metal layer.

Hereinafter, at least one embodiment will be described with reference to the drawings. In FIGS. 1 to 16, the same components are denoted by the same reference numerals, and redundant description will be omitted.

First Embodiment

FIG. 1 is a cross-sectional view illustrating a structure of the semiconductor device according to the first embodiment. The semiconductor device of FIG. 1 is a three-dimensional memory in which an array region 1 and a circuit region 2 are adhered together.

FIG. 1 illustrates X, Y, and Z directions perpendicular to each other. In the present specification, the +Z direction is treated as an upward direction, and the −Z direction is treated as a downward direction. The −Z direction may or may not coincide with the direction of gravity.

The array region 1 includes a memory cell array 11 including a plurality of memory cells, a substrate 12 on the memory cell array 11, and an interlayer insulating film 13 under the memory cell array 11. The substrate 12 is, for example, a semiconductor substrate such as a silicon substrate. The interlayer insulating film 13 is, for example, a silicon oxide film or a stacked film including a silicon oxide film and another insulating film. The substrate 12 is an example of the first layer and the second substrate. The interlayer insulating film 13 is an example of the first insulating film.

The circuit region 2 is provided below the array region 1. Reference numeral S denotes an adhering surface between the array region 1 and the circuit region 2. The circuit region 2 includes an interlayer insulating film 14 and a substrate 15 under the interlayer insulating film 14. The interlayer insulating film 14 is, for example, a silicon oxide film or a stacked film including a silicon oxide film and another insulating film. The substrate 15 is, for example, a semiconductor substrate such as a silicon substrate. The substrate 15 is an example of the first substrate. The interlayer insulating film 14 is an example of the first insulating film together with the interlayer insulating film 13.

The array region 1 includes a plurality of word lines WL as a plurality of electrode layers in the memory cell array 11. FIG. 1 illustrates a staircase structure portion 21 of the memory cell array 11. Each word line WL is electrically connected to a word wiring layer 23 via a contact plug 22. Each columnar portion CL penetrating the plurality of word lines WL is electrically connected to the bit line BL via the via plug 24.

The circuit region 2 includes a plurality of transistors 31. Each transistor 31 includes a gate electrode 32 provided on the substrate 15 via a gate insulating film and a source diffusion layer (not illustrated) and a drain diffusion layer (not illustrated) provided in the substrate 15. The circuit region 2 includes a plurality of contact plugs 33 provided on the gate electrode 32, the source diffusion layer, or the drain diffusion layer of the transistors 31, a wiring layer 34 provided on the contact plugs 33 and including a plurality of wirings, and a wiring layer 35 provided on the wiring layer 34 and including a plurality of wirings.

The circuit region 2 further includes a wiring layer 36 provided on the wiring layer 35 and including a plurality of wirings, a plurality of via plugs 37 provided on the wiring layer 36, and a plurality of metal pads 38 provided on the via plugs 37. The metal pad 38 is, for example, a metal layer including a Cu (copper) layer or an Al (aluminum) layer. The circuit region 2 functions as a control circuit (logic circuit) that controls the operations of the array region 1. The control circuit is configured with the transistors 31 and the like and is electrically connected to the metal pad 38.

The array region 1 includes a plurality of metal pads 41 provided on the metal pads 38 and a plurality of via plugs 42 provided on the metal pads 41. The array region 1 includes a wiring layer 43 provided on the via plugs 42 and including a plurality of wirings and a wiring layer 44 provided on the wiring layer 43 and including a plurality of wirings. The metal pad 41 is, for example, a metal layer including a Cu layer or an Al layer. The above-mentioned bit line BL is provided in the wiring layer 44. The above-mentioned control circuit is electrically connected to the memory cell array 11 via the metal pads 41 and 38 and the like. The control circuit controls the operations of the memory cell array 11 via the metal pads 41 and 38 and the like.

The array region 1 further includes a plurality of via plugs 45 provided on the wiring layer 44, a plurality of via plugs 46 provided on the via plugs 45, and a plurality of metal layers 47 provided on the via plugs 46. The via plug 46 is provided in the interlayer insulating film 13, and the metal layer 47 is provided in the substrate 12. Each metal layer is provided on corresponding one via plug 46 and is electrically connected to the via plug 46. The via plug 46 is an example of the first plug, and the metal layer 47 is an example of the first metal layer. Further details of the via plug 46 and the metal layer 47 are described below.

The array region 1 further includes an insulating film 51 provided on the substrate 12, an insulating film 52, a metal layer 53, and a passivation film 54.

The insulating film 51 is formed on the substrate 12. The insulating film 51 is, for example, a silicon oxide film. The insulating film 52 includes a sideward portion 52a formed on the side surfaces of the substrate 12 and the insulating film 51 and an upward portion 52b formed on the upper surface of the insulating film 51. The sideward portion 52a functions as a side wall insulating film of the substrate 12 and the insulating film 51. The insulating film 52 is, for example, a silicon oxide film. The insulating film 51 and the insulating film 52 together with the substrate 12 are examples of the first layer and further are examples of the second insulating film.

Each of the substrate 12 and the insulating film 51 has an opening that reaches the interlayer insulating film 13. The insulating film 52 is formed on the side surfaces of the substrate 12 and the insulating film 51 in the opening. The metal layer 47 is disposed in the opening. As will be described later, the metal layer 47 of the embodiment functions as an etching stopper when the opening is formed in the substrate 12 and the insulating film 51 by etching. Accordingly, it is possible to prevent the via plug 46 from being etched by the etching for forming the opening.

The metal layer 53 includes an upward portion 53a formed on the upper surface of the interlayer insulating film 13 and the metal layer 47, a sideward portion 53b formed on the side surface of the insulating film 52, and an upward portion 53c formed on the upper surface of the insulating film 52. The upward portion 53a and the sideward portion 53b are disposed inside the opening, and the upward portion 53c is disposed outside the opening. The metal layer 53 is electrically connected to each metal layer 47. The metal layer 53 includes, for example, an Al layer. The metal layer 53 is an example of a second metal layer. The upward portion 53a and the sideward portion 53b are examples of the first portion, and the upward portion 53c of the metal layer 53 is an example of the second portion.

The passivation film 54 includes an insulating film 54a, an insulating film 54b, and an insulating film 54c which are sequentially formed on the insulating film 52 and the metal layer 53. The insulating film 54a is, for example, a silicon oxide film. The insulating film 54b is, for example, a silicon nitride film. The insulating film 54c is, for example, a polyimide film.

The passivation film 54 has, for example, an opening P that exposes the upper surface of the upward portion 53c of the metal layer 53. The upward portion 53c exposed in the opening P functions as an external connection pad (bonding pad) of the semiconductor device of FIG. 1. The upward portion 53c can be connected to a mounting substrate or other devices by a bonding wire, a solder ball, a metal bump, or the like via the opening P.

Figure 2:
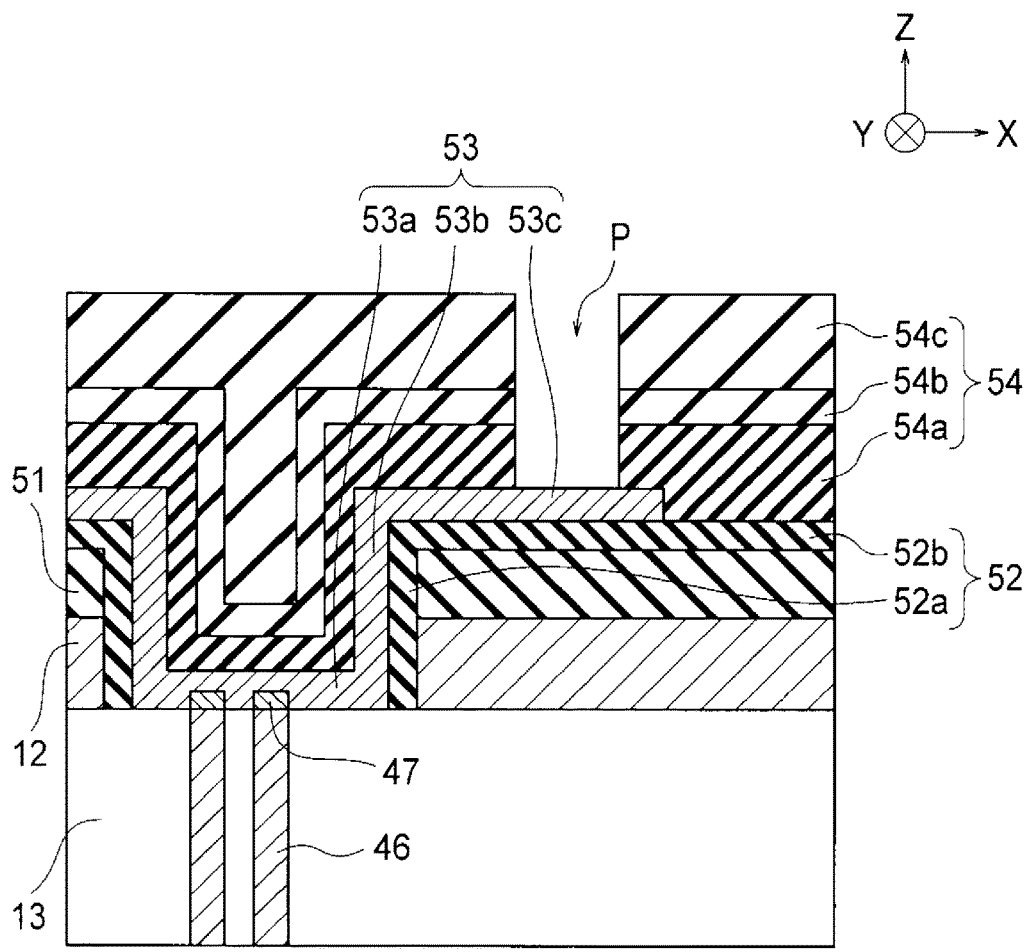
FIG. 2 is an enlarged cross-sectional view illustrating the structure of the semiconductor device.

FIG. 2 is an enlarged cross-sectional view illustrating the structure of the semiconductor device according to the first embodiment. FIG. 2 illustrates the via plug 46, the metal layer 47, the metal layer 53, and the like described above.

The via plug 46 and the metal layer 47 of at least one embodiment contain different metal elements. Each via plug 46 includes, for example, a simple metal element layer or a compound metal layer containing a W (tungsten) element. Each metal layer 47 includes, for example, a simple metal element layer or a compound metal layer containing an Al (aluminum) element, an Hf (hafnium) element, or a Zr (zirconium) element. In at least one embodiment, each via plug 46 includes a W layer, and each metal layer 47 includes an Al layer. The metal element in the via plug 46 is an example of the first metal element. The metal element in the metal layer 47 is an example of the second metal element. When the metal layer 47 is formed by injecting metal atoms into the substrate 12 as described later, each metal layer 47 further contains an element (for example, a silicon element) contained in the substrate 12.

The metal layer 47 functions as an etching stopper when the opening is formed in the substrate 12 and the insulating film 51 by etching. Accordingly, it is possible to prevent the via plug 46 from being etched by the etching for forming the opening. In at least one embodiment, since the via plug 46 and the metal layer 47 contain different metal elements, the metal layer 47 functions as an etching stopper for preventing etching of the via plug 46.

The metal layer 47 may be completely removed by etching for forming an opening or subsequent etching. Here, the metal layer 53 is formed to be in contact with the upper surface of each via plug 46, so that the metal layer 53 is directly electrically connected to each via plug 46. On the other hand, the metal layer 53 illustrated in FIG. 2 is formed on each via plug 46 via the metal layer 47, so that the metal layer 53 is electrically connected to each via plug 46 via the metal layer 47.

The semiconductor device according to at least one embodiment includes the N (N is an integer of 2 or more) via plugs 46, and the N metal layers 47 are provided on the via plugs 46. As described above, the via plugs 46 and the metal layers 47 of at least one embodiment have a one-to-one correspondence. FIG. 2 illustrates two via plugs 46 and two metal layers 47 among the via plugs 46 and the metal layers 47. The value of N in at least one embodiment is, for example, 100 to 10000. The metal layers 47 of at least one embodiment may be arranged in any form, and for example, are arranged in a two-dimensional array configuration in a square lattice form in the XY plane. The planar shape of each metal layer 47 of at least one embodiment is, for example, a circle.

Figure 3:
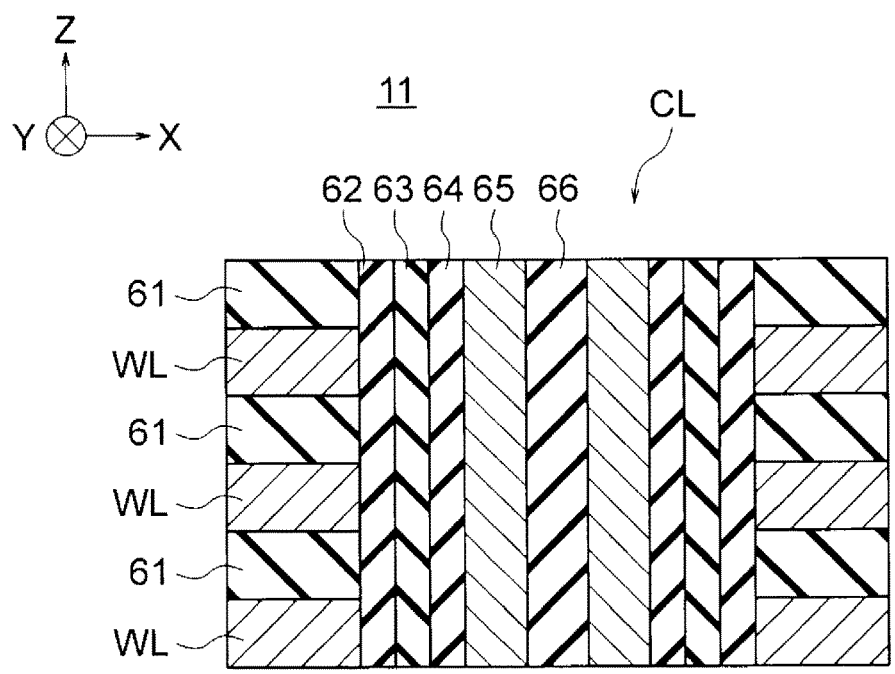
FIG. 3 is a cross-sectional view illustrating a structure of a columnar portion.

FIG. 3 is a cross-sectional view illustrating a structure of the columnar portion CL of the first embodiment.

As illustrated in FIG. 3, the memory cell array 11 includes a plurality of word lines WL and a plurality of insulating layers 61 which are alternately stacked on the interlayer insulating film 13 (refer to FIG. 1). The word line WL is, for example, a metal layer including a W (tungsten) layer. The insulating layer 61 is, for example, a silicon oxide film.

The columnar portion CL sequentially includes a block insulating film 62, a charge storage layer 63, a tunnel insulating film 64, a channel semiconductor layer 65, and a core insulating film 66. The charge storage layer 63 is, for example, a silicon nitride film and is formed on the side surface of the word line WL and the insulating layer 61 via the block insulating film 62. The charge storage layer 63 may be a semiconductor layer such as a polysilicon layer. The channel semiconductor layer 65 is, for example, a polysilicon layer and is formed on the side surface of the charge storage layer 63 via the tunnel insulating film 64. The block insulating film 62, the tunnel insulating film 64, and the core insulating film 66 are, for example, a silicon oxide film or a metal insulating film.

FIGS. 4A to 11C are cross-sectional views illustrating a method of manufacturing the semiconductor device according to the first embodiment. As described below, the semiconductor device according to at least one embodiment is manufactured by adhering an array wafer W1 including a plurality of array regions 1 and a circuit wafer W2 including a plurality of circuit regions 2.

First, the substrate 12 is prepared, and the memory cell array 11 and an insulating film 13a which is a portion of the interlayer insulating film 13 are formed on the substrate 12 (FIG. 4A). FIG. 4A further illustrates the word line WL, the columnar portion CL, and the staircase structure portion 21 in the memory cell array 11. The insulating film 13a is an example of the first insulating film.

Next, a hard mask layer 71 is formed on the insulating film 13a, and openings H1, H2, and H3 are formed in the insulating film 13a by reactive ion etching (RIE) using the hard mask layer 71 as a mask (FIG. 4B). The opening H1 is formed to reach the substrate 12. The opening H2 is formed to reach the word line WL. The opening H3 is formed to reach the columnar portion CL. The hard mask layer 71 is, for example, a carbon layer. Next, the hard mask layer 71 is removed by ashing. The opening H1 is an example of a second opening.

Figure 5A:
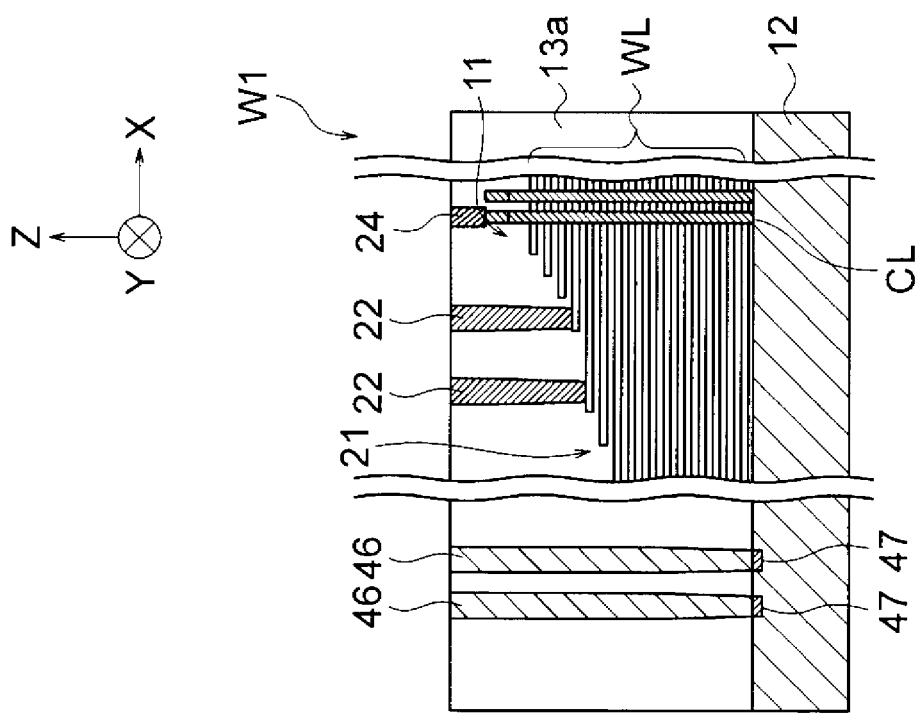
FIGS. 5A and 5B are cross-sectional views (2/8) illustrating a method of manufacturing the semiconductor device.

Next, a resist layer 72 is formed on the insulating film 13a (FIG. 5A). The resist layer 72 is formed so that the opening H1 is not covered with the resist layer 72. Next, metal atoms are injected into the substrate 12 exposed in the opening H1 by ion implantation using the resist layer 72 as a mask (FIG. 5A). As a result, the metal layer 47 is formed in the substrate 12 exposed in the opening H1. FIG. 5A illustrates the two metal layers 47 formed in the substrate 12 exposed in the two openings H1. The metal atom is, for example, an Al atom, and, the metal layer 47 is a layer containing an Al atom. The surface concentration of Al atoms in the metal layer 47 is, for example, about $1.0 \times 10^{16}/cm^2$. The above-mentioned metal atom may be an Hf atom or a Zr atom. Next, the resist layer 72 is removed by ashing.

Figure 5B:
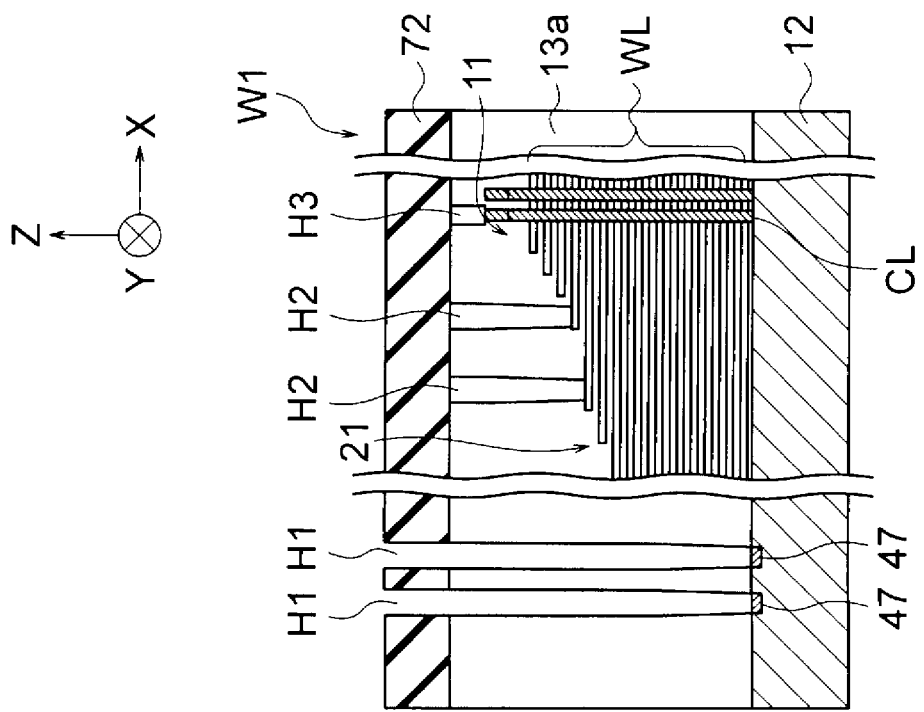

Next, a metal material layer is formed on the entire surface of the substrate 12, and the surface of the metal material layer is flattened by chemical mechanical polishing (CMP) (FIG. 5B). As a result, the via plug 46, the contact plug 22, and the via plug 24 are formed in the openings H1, H2, and H3 by the metal material layers, respectively. For example, in each opening H1, one via plug 46 is formed on one metal layer 47. The metal material layer is, for example, a stacked film including a barrier metal layer and a plug material layer. The barrier metal layer contains, for example, Ti (titanium) elements or Ta (tantalum) elements. The plug material layer contains, for example, W elements and is the W layer.

Figure 6A:
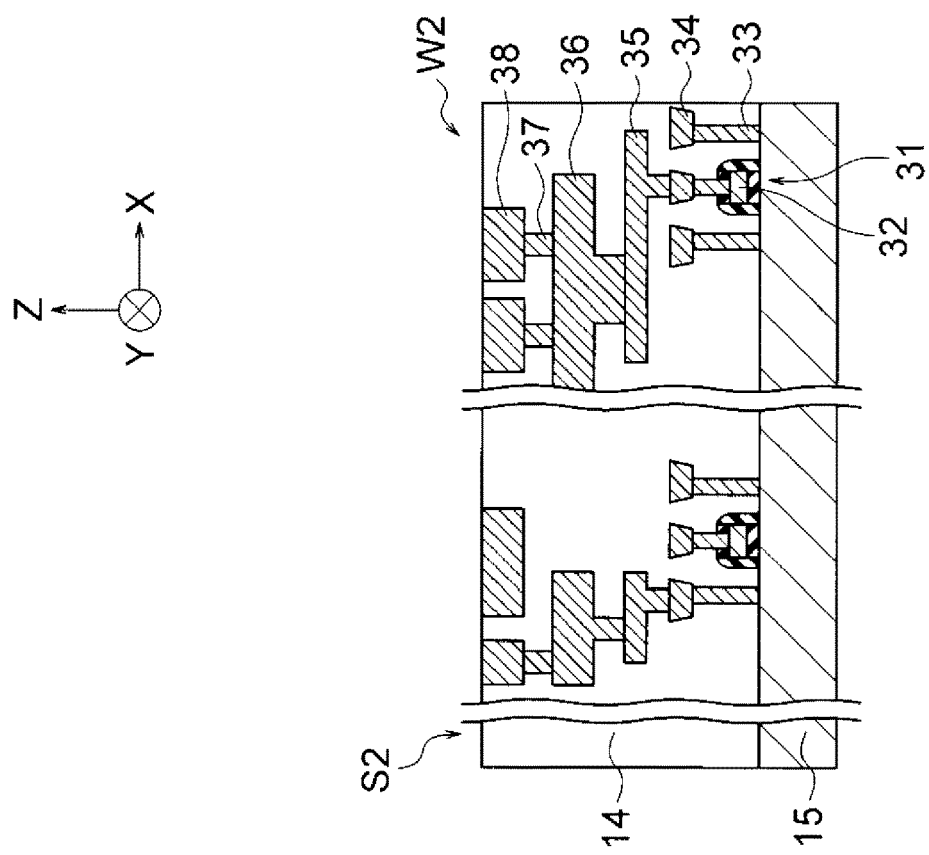
FIGS. 6A and 6B are cross-sectional views (3/8) illustrating the method of manufacturing the semiconductor device.

Next, an insulating film 13b which is a portion of the interlayer insulating film 13, the word wiring layer 23, the bit line BL, the via plug 45, the wiring layer 44, the wiring layer 43, and the via plug 42, the metal pad 41 and the like are formed on the substrate 12 via the insulating film 13a or the like (FIG. 6A). By doing so, the array wafer W1 is manufactured. FIG. 6A illustrates an upper surface S1 of the array wafer W1.

Figure 6B:
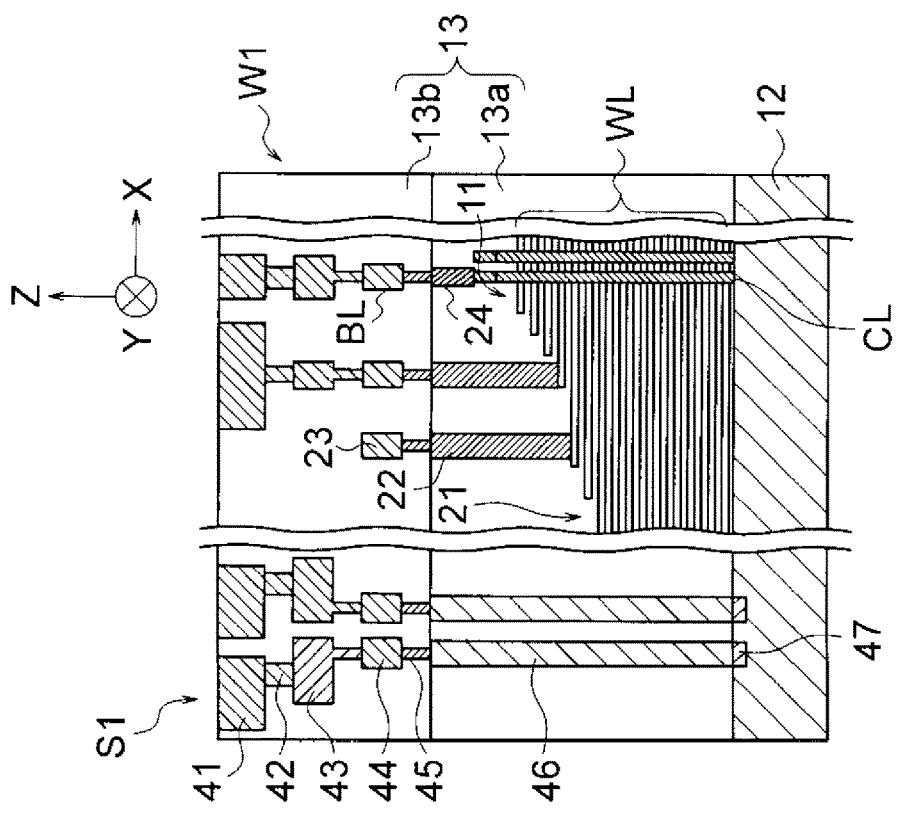

Next, the substrate 15 is prepared, and the interlayer insulating film 14, the transistor 31, the gate electrode 32, the contact plug 33, the wiring layer 34, the wiring layer 35, the wiring layer 36, the via plug 37, the metal pad 38, and the like are formed on the substrate 15 (FIG. 6B). By doing so, the circuit wafer W2 is manufactured. FIG. 6B illustrates an upper surface S2 of the circuit wafer W2.

Figure 7:
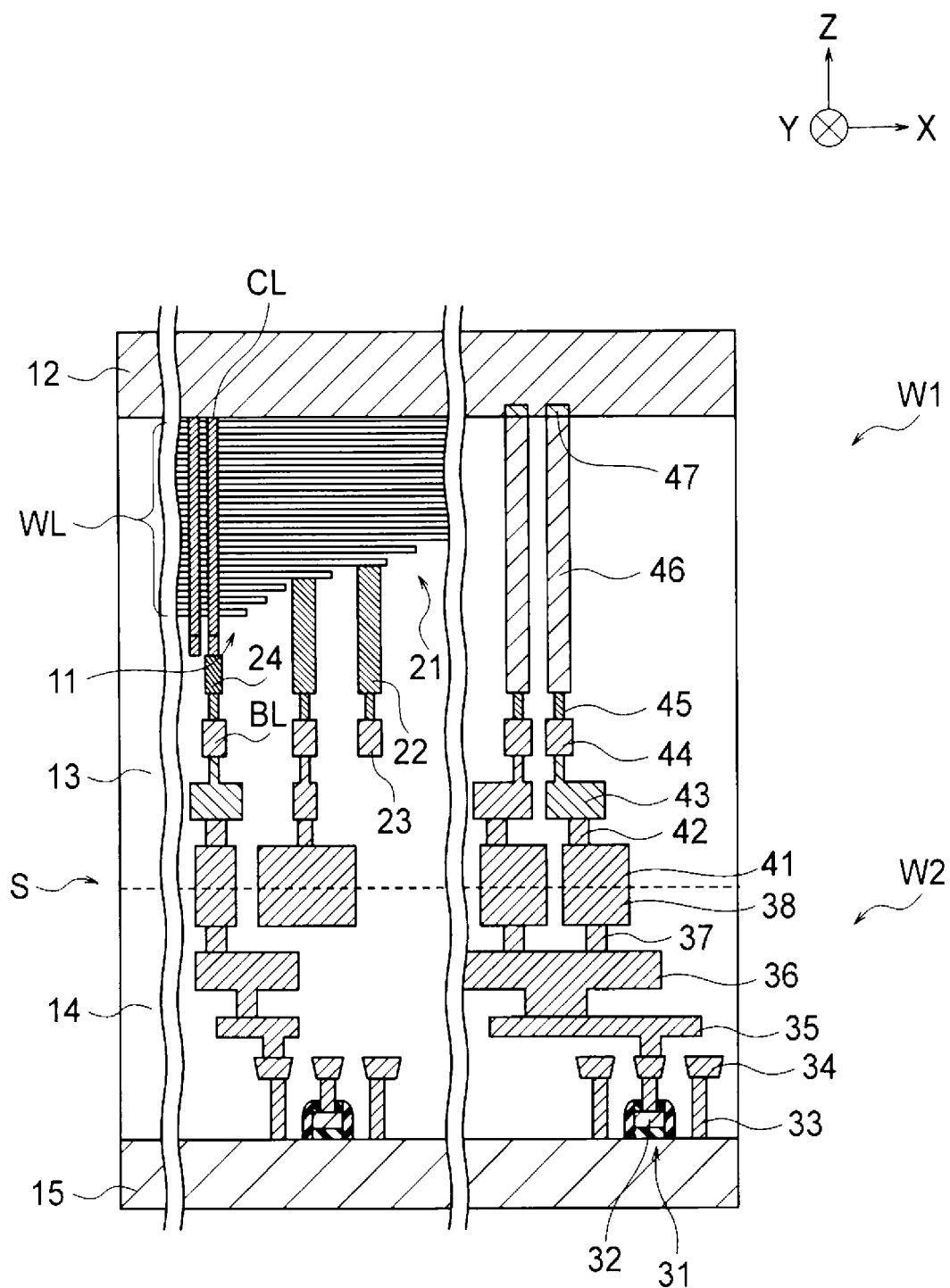
FIG. 7 is a cross-sectional view (4/8) illustrating the method of manufacturing the semiconductor device.

Next, the array wafer W1 and the circuit wafer W2 are adhered together (FIG. 7). Specifically, the substrate 12 and the substrate 15 are adhered together via the memory cell array 11, the interlayer insulating film 13, the interlayer insulating film 14, the transistor 31, the via plug 46, the metal layer 47, and the like. In FIG. 7, the array wafer W1 is adhered to the circuit wafer W2 by inverting the vertical orientation of the array wafer W1. As a result, the substrate 12 is disposed above the substrate 15. In the adhering process, the interlayer insulating film 13 and the interlayer insulating film 14 are attached by mechanical pressure, and the metal pad 41 and the metal pad 38 are bonded by annealing.

Figure 8:
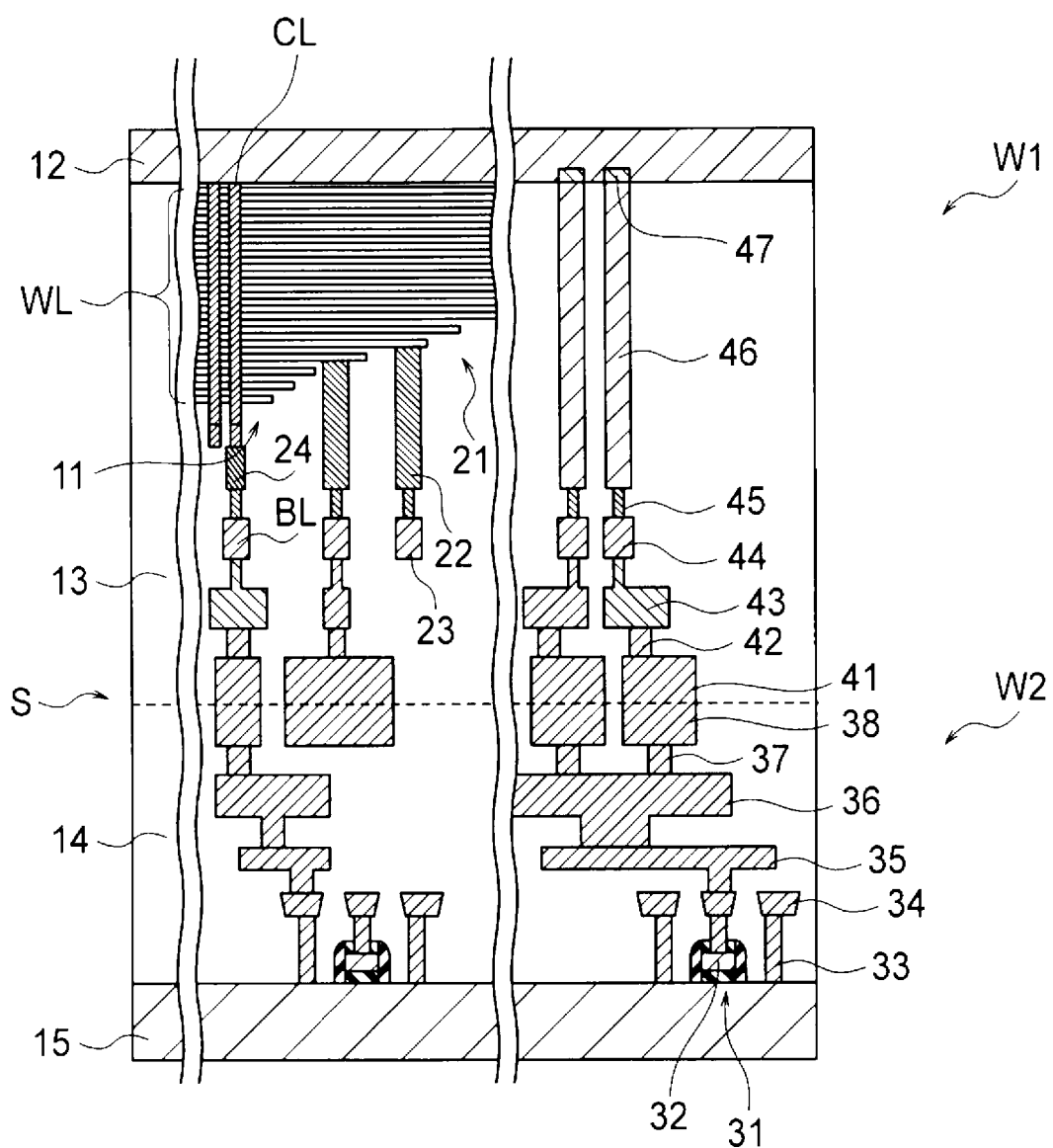
FIG. 8 is a cross-sectional view (5/8) illustrating the method of manufacturing the semiconductor device.

Next, the substrate 12 is thinned by backgrinding and wet etching (FIG. 8). As a result, the thickness of the substrate 12 becomes thin.

FIGS. 9A to 11C are enlarged cross-sectional views illustrating the above-mentioned substrate 12, via plug 46, metal layer 47, and the like.

Next, the insulating film 51 is formed on the substrate (FIG. 9A). Next, the insulating film 51 above the metal layer 47 is etched by RIE (FIG. 9B). As a result, an opening H4 is formed in the insulating film 51, and thus, the substrate 12 is exposed in the opening H4. Next, the substrate 12 exposed in the opening H4 is etched by RIE (FIG. 9C). As a result, the opening H4 is also formed in the substrate 12, and thus, the interlayer insulating film 13 and the metal layer 47 are exposed in the opening H4. The opening H4 is an example of the first opening.

The metal layer 47 functions as an etching stopper during the RIE of FIG. 9C. Accordingly, it is possible to prevent the via plug 46 from being etched by the RIE. In at least one embodiment, since the via plug 46 and the metal layer 47 contain different metal elements, the metal layer 47 functions as an etching stopper for preventing etching of the via plug 46.

The RIE of FIG. 9C is performed by using, for example, an etching gas containing an F (fluorine) element. Examples of the etching gas are $SF_6$ gas and $CF_4$ gas (S represents sulfur and C represents carbon). The etching gas may contain $O_2$ gas together with $SF_6$ gas and/or $CF_4$ gas (O represents oxygen).

The etching gas containing the F element can etch the substrate 12 at a high speed. Here, when the metal layer 47 is not formed on the via plug 46, the via plug 46 is also etched at a high speed together with the substrate 12. According to at least one embodiment, by forming the metal layer 47 on the via plug 46 in advance before the RIE of FIG. 9C, it is possible to prevent the etching of the via plug 46.

Therefore, it is desirable that the metal layer 47 has high resistance to an etching gas containing an F element. An example of such a metal layer 47 is a simple metal element layer or a compound metal layer containing an Al element, an Hf element, or a Zr element. Accordingly, it is possible to prevent the etching of the via plug 46 while etching the substrate 12 at a high speed with the etching gas containing the F element.

Next, the insulating film 52 is formed on the entire surface of the substrate 12 (FIG. 10A). As a result, the insulating film 52 is formed on the surfaces of the metal layer 47, the interlayer insulating film 13, the substrate 12, and the insulating film 51.

Next, the insulating film 52 on the metal layer 47 and the interlayer insulating film 13 is removed (FIG. 10B). As a result, the surfaces of the metal layer 47 and the interlayer insulating film 13 are exposed in the opening H4. The insulating film 52 is processed into a shape including the sideward portion 52a and the upward portion 52b. The process of FIG. 10B is performed, for example, by covering a portion of the insulating film 52 (portion corresponding to the sideward portion 52a and the upward portion 52b) with the resist layer and removing the other portions of the insulating film 52 by etching.

Next, the metal layer 53 is formed on the entire surface of the substrate 12 (FIG. 10C). As a result, the metal layer 53 is formed on the surfaces of the metal layer 47, the interlayer insulating film 13, and the insulating film 52.

Next, a portion of the metal layer 53 on the upper surface of the insulating film 52 is removed (FIG. 11A). As a result, the metal layer 53 is processed into a shape including the upward portion 53a, the sideward portion 53b, and the upward portion 53c.

The metal layer 47 may be completely removed before the process of FIG. 10C is performed. Here, the metal layer 53 is formed to be in contact with the upper surface of each via plug 46, so that the metal layer 53 is directly electrically connected to each via plug 46. On the other hand, the metal layer 53 illustrated in FIG. 11A is formed on each via plug 46 via the metal layer 47, so that the metal layer 53 is electrically connected to each via plug 46 via the metal layer 47.

Next, the insulating films 54a, 54b, and 54c of the passivation film 54 are sequentially formed on the entire surface of the substrate 12 (FIG. 11B). As a result, the passivation film 54 is formed on the surfaces of the insulating film 52 and the metal layer 53.

Next, a portion of the passivation film 54 on the upper surface of the upward portion 53c is removed (FIG. 11C). As a result, the opening P is formed in the passivation film 54, and the upper surface of the upward portion 53c is exposed in the opening P. The upward portion 53c exposed in the opening P functions as a bonding pad.

Next, the array wafer W1 and the circuit wafer W2 are cut into a plurality of chips by dicing. The chips are cut so that each chip contains one array region 1 and one circuit region 2. By doing so, the semiconductor device of FIG. 1 is manufactured.

Figure 12:
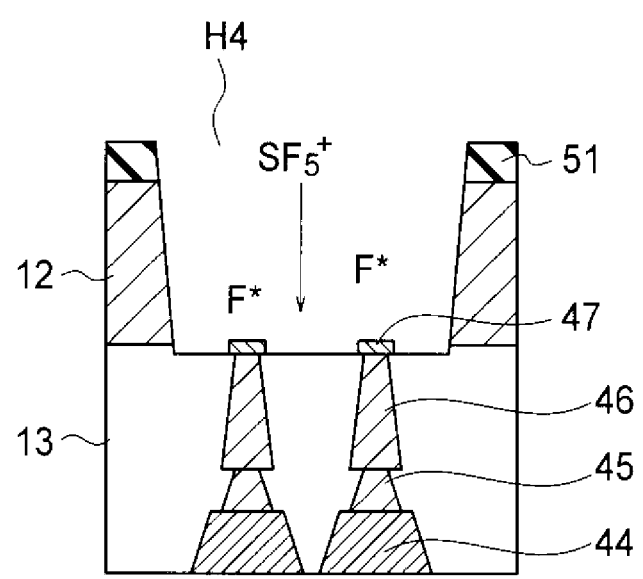
FIG. 12 is another cross-sectional view illustrating the method of manufacturing the semiconductor device.

FIG. 12 is another cross-sectional view illustrating a method of manufacturing the semiconductor device according to the first embodiment.

FIG. 12 is a cross-sectional view corresponding to FIG. 9C and illustrates a process of forming the opening H4 in the substrate 12. In at least embodiment, the metal layer 47 is formed on the via plug 46.

The process of FIG. 12 is performed by using an etching gas containing $SF_6$ gas and $O_2$ gas. FIG. 12 illustrates $SF_5^+$ and F* produced from $SF_6$ gas. The etching gas has a high speed of etching the substrate 12. Therefore, in at least one embodiment, the opening H4 can be formed in the substrate 12 in a short time even if the substrate 12 is thick.

The process of FIG. 12 is further performed in a state where the metal layer 47 is formed on the via plug 46. The metal layer 47 of at least one embodiment contains a simple metal element layer or a compound metal layer containing an Al element, an Hf element, or a Zr element, and thus, the metal layer 47 has high resistance to an etching gas containing an F element. Therefore, in at least one embodiment, etching of the via plug 46 can be prevented even if the substrate 12 is thin.

As described above, according to at least one embodiment, it is possible to easily achieve both the formation of the opening H4 in the substrate 12 in a short time and the preventing of etching of the via plug 46.

As illustrated in FIG. 12, the opening H4 of at least one embodiment may be formed so that the side surfaces of the substrate 12 and the insulating film 51 are tapered surfaces.

As described above, the opening H4 of the substrate 12 of the embodiment is formed in a state where the metal layer 47 is provided in advance on the via plug 46. Therefore, according to at least one embodiment, it is possible to appropriately form the metal layer 53 on the via plug 46. For example, it is possible to form the metal layer 53 via the metal layer 47 on the via plug 46 that is not etched by RIE for forming the opening H4. It is possible to perform the RIE in a short time.

Second Embodiment

Figure 13:
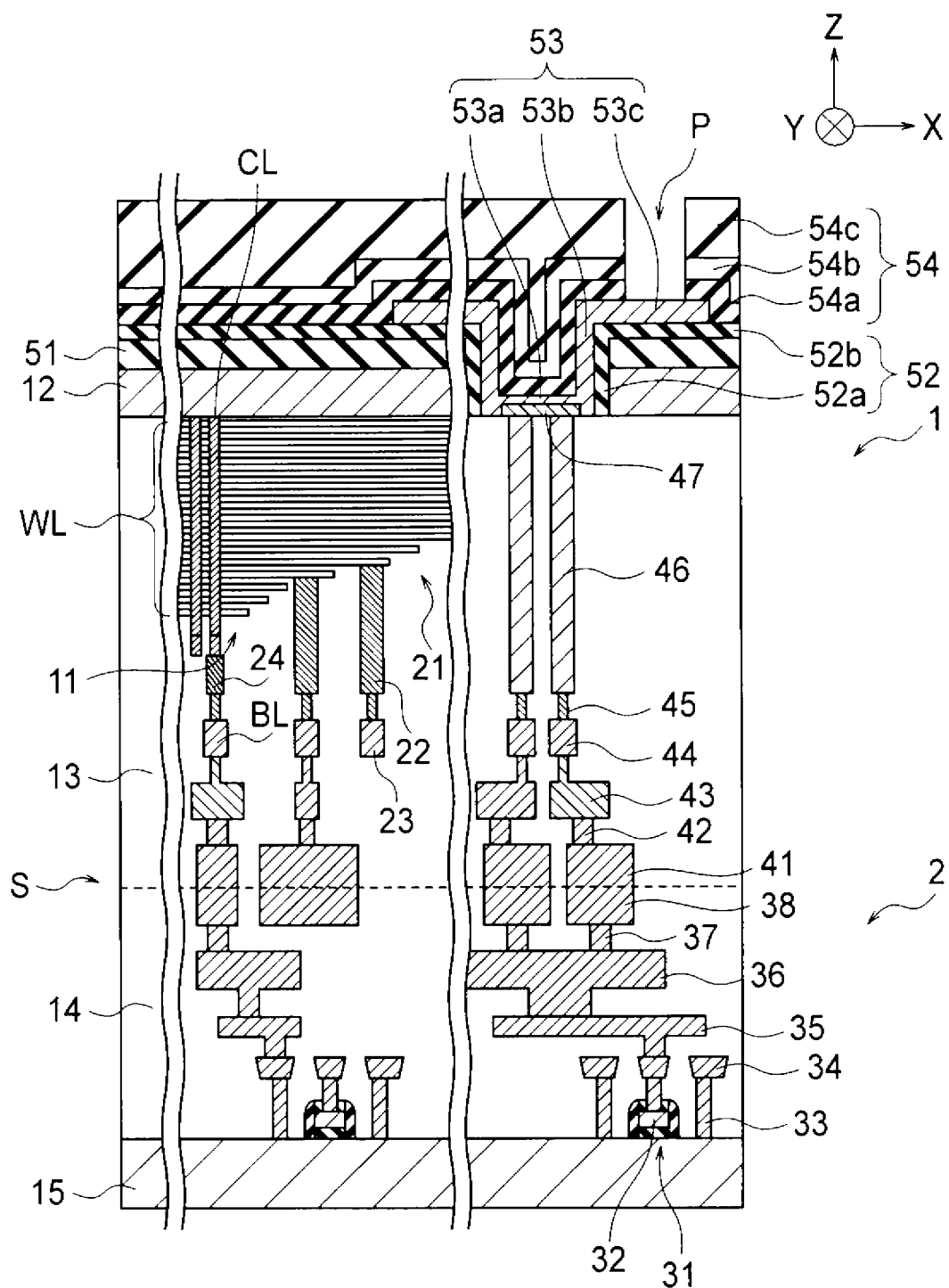
FIG. 13 is a cross-sectional view illustrating a structure of a semiconductor device according to a second embodiment.

FIG. 13 is a cross-sectional view illustrating a structure of a semiconductor device according to a second embodiment.

The semiconductor device according to the second embodiment includes the same components as the semiconductor device according to the first embodiment illustrated in FIG. 1. However, while the semiconductor device according to the first embodiment includes the plurality of metal layers 47 on the plurality of via plugs 46, the semiconductor device according to the second embodiment includes one metal layer 47 on the plurality of via plugs 46. The metal layer 53 of the second embodiment is formed on the metal layer 47.

Figure 14:
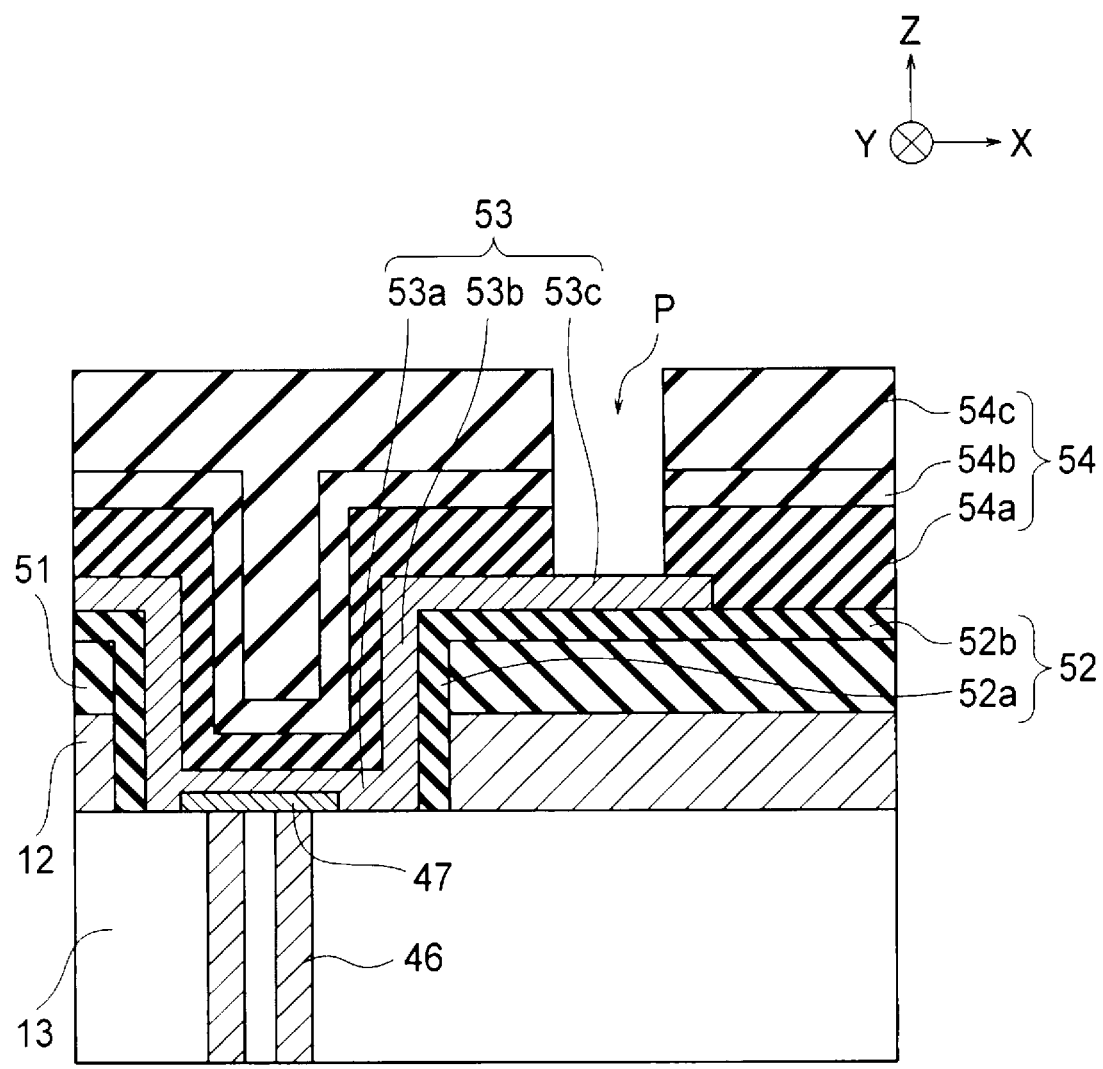
FIG. 14 is an enlarged cross-sectional view illustrating the structure of the semiconductor device.

FIG. 14 is an enlarged cross-sectional view illustrating the structure of the semiconductor device according to the second embodiment. FIG. 14 illustrates the via plug 46, the metal layer 47, the metal layer 53, and the like described above.

Similar to the first embodiment, the via plug 46 and the metal layer 47 of the second embodiment contain different metal elements. For example, each via plug 46 includes a W layer, and each metal layer 47 includes an Al layer. In at least one embodiment, since the via plug 46 and the metal layer 47 contain different metal elements, the metal layer 47 functions as an etching stopper for preventing etching of the via plug 46.

The semiconductor device according to at least one embodiment includes N (N is an integer of 2 or more) via plugs 46, and one metal layer 47 is provided on the via plugs 46. The value of N in the second embodiment is, for example, 100 to 10000, similar to the first embodiment. The via plugs 46 of the second embodiment may be arranged in any form, and for example, are arranged in a two-dimensional array configuration in a square lattice form in the XY plane. The planar shape of each metal layer 47 of at least one embodiment is a quadrangle such as a square or a rectangle.

The semiconductor device according to at least one embodiment may include the metal layers 47 of which number is less than N on the N via plugs 46. For example, the semiconductor device according to at least one embodiment may include n metal layers 47 on k×n via plugs 46 (k and n are integers of 2 or more). It is desirable to provide each metal layer 47 on the corresponding k via plugs 46.

Figure 15B:
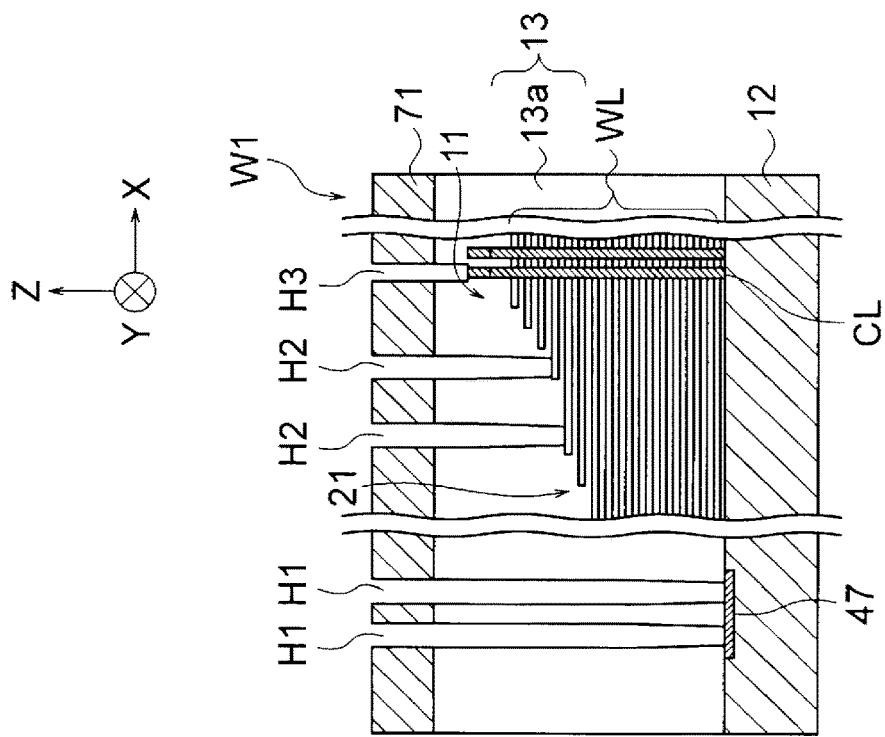
FIGS. 15A and 15B are cross-sectional views illustrating a method of manufacturing the semiconductor device.
Figure 15A:
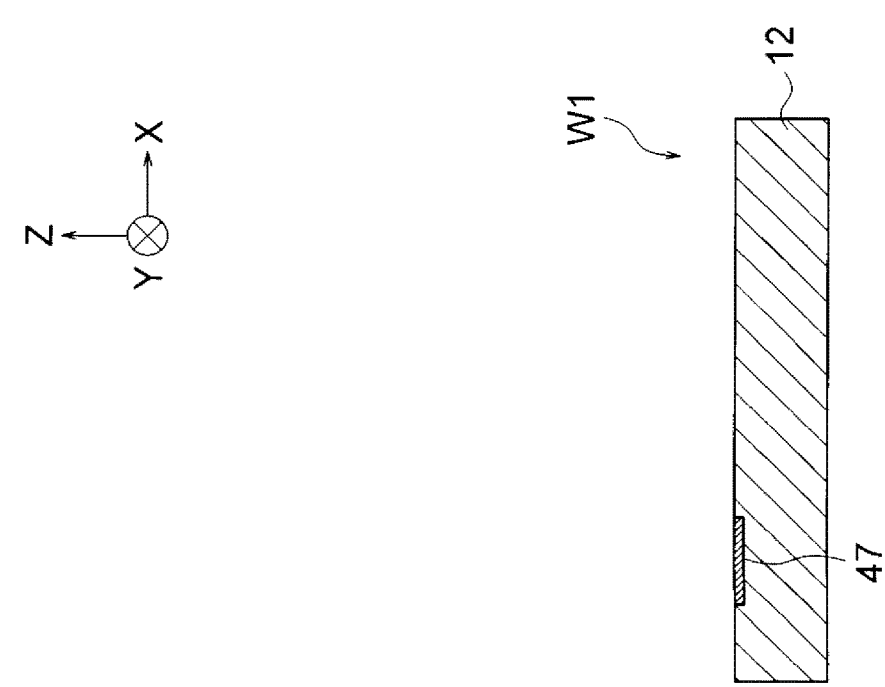

FIGS. 15A and 15B are cross-sectional views illustrating a method of manufacturing the semiconductor device according to the second embodiment. Similar to the first embodiment, the semiconductor device of the embodiment is also manufactured by adhering the array wafer W1 including the plurality of array regions 1 and the circuit wafer W2 including the plurality of circuit regions 2.

First, the substrate 12 is prepared, and the metal layer 47 is formed in the substrate 12 (FIG. 15A). The metal layer 47 is formed in the substrate 12 by, for example, forming a recess portion in the substrate 12 by lithography and RIE and burying the metal layer 47 in the recess portion. The method for forming the metal layer 47 is, for example, plasma chemical vapor deposition (CVD) or sputtering. Here, the metal layer 47 is formed, for example, by forming the metal layer 47 inside and outside the recess portion of the substrate 12 by CVD or sputtering and removing the metal layer 47 outside the recess portion of the substrate 12 by etchback. The metal layer 47 is, for example, an Al layer, an Hf layer, or a Zr layer.

Next, the memory cell array 11 and the insulating film 13a which is a portion of the interlayer insulating film 13 are formed on the substrate 12 and the metal layer 47 (FIG. 15B). FIG. 15B further illustrates the word line WL, the columnar portion CL, and the staircase structure portion 21 in the memory cell array 11.

Next, the hard mask layer 71 is formed on the insulating film 13a, and the openings H1 to H3 are formed in the insulating film 13a by RIE using the hard mask layer 71 as a mask (FIG. 15B). The opening H1 is formed to reach the metal layer 47. The opening H2 is formed to reach the word line WL. The opening H3 is formed to reach the columnar portion CL. In the embodiment, the plurality of openings H1 are formed to reach one metal layer 47, and thus, the metal layer 47 is exposed in each opening H1.

In at least one embodiment, next, the process of FIG. 5A is omitted, and the processes of FIGS. 5B to 11B are performed. In the process of FIG. 5B, the via plug 46 is formed on the metal layer 47 exposed in each opening H1. In the process of FIG. 9C, one metal layer 47 is exposed in the opening H4. In the process of FIG. 10C, the metal layer 53 is formed on the metal layer 47. By doing so, the semiconductor device of FIG. 13 is manufactured.

Figure 16:
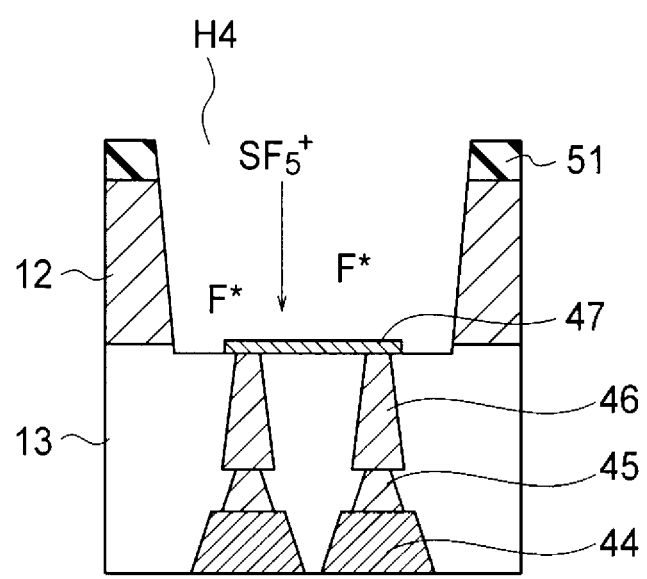
FIG. 16 is another cross-sectional view illustrating the method of manufacturing the semiconductor device.

FIG. 16 is another cross-sectional view illustrating the method of manufacturing the semiconductor device according to the second embodiment.

FIG. 16 is a cross-sectional view corresponding to FIG. 9C and illustrates a process of forming the opening H4 in the substrate 12. In at least one embodiment, one metal layer 47 is formed on the plurality of via plugs 46.

The process of FIG. 16 is performed by using an etching gas containing $SF_6$ gas and $O_2$ gas. Therefore, in the embodiment, the opening H4 can be formed in the substrate 12 in a short time even if the substrate 12 is thick.

The process of FIG. 16 is further performed in a state where the metal layer 47 is formed on the via plug 46. Therefore, in at least one embodiment, etching of the via plug 46 can be prevented even if the substrate 12 is thin.

As described above, according to the second embodiment, similar to the first embodiment, it is possible to easily achieve both the formation of the opening H4 in the substrate 12 in a short time and the preventing of etching of the via plug 46.

As described above, the opening H4 of the substrate 12 of the second embodiment is formed in a state where one metal layer 47 is provided in advance on the plurality of via plugs 46. Therefore, according to the second embodiment, it is possible to appropriately form the metal layer 53 on the via plug 46 similar to the first embodiment. For example, it is possible to form the metal layer 53 via the metal layer 47 on the via plug 46 that is not etched by the RIE for forming the opening H4. It is possible to perform the RIE in a short time.

In the second embodiment, the plurality of metal layers 47 may be formed in the substrate 12 in the process of FIG. 15A, and the corresponding one opening H1 may be formed on each metal layer 47 in the process of FIG. 15B. Accordingly, it is possible to form the plurality of metal layers 47 as in the first embodiment by plasma CVD or sputtering instead of ion implantation. On the contrary, in the second embodiment, one metal layer 47 may be formed by ion implantation instead of plasma CVD or sputtering in the process of FIG. 15A.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
   a first substrate;
   a first insulating film disposed on the first substrate;
   a first plug disposed in the first insulating film;
   a first layer disposed on the first insulating film;
   a first metal layer provided above the first plug being in contact with the first plug, and wherein the first metal layer is formed in the first layer; and
   a second metal layer including (i) a first portion provided in the first layer and (ii)
   a second portion disposed on the first layer and electrically connected to the first metal layer.

2. The semiconductor device according to claim 1, wherein the first layer includes a second substrate.

3. The semiconductor device according to claim 2, wherein the first layer further includes a second insulating film disposed on an upper surface and a side surface of the second substrate.

4. The semiconductor device according to claim 3, wherein
the first plug contains a first metal element, and
the first metal layer contains a second metal element different from the first metal element.

5. The semiconductor device according to claim 4, wherein
the first metal element includes a tungsten (W) element, and
the second metal element includes at least one of an aluminum (Al) element, a hafnium (Hf) element, or a zirconium (Zr) element.

6. The semiconductor device according to claim 1, wherein:
the first plug includes N plugs, N being an integer of at least 2; and
the first metal layer includes N metal layers provided on the N plugs.

7. The semiconductor device according to claim 1, wherein:
the first plug includes N plugs, N being an integer of least 2; and
the first metal layer includes one metal layer disposed on the N plugs.

8. The semiconductor device according to claim 1, wherein the second portion of the second metal layer includes a bonding pad.

9. A semiconductor device comprising:
a first insulating film;
a first plug disposed in the first insulating film;
a substrate disposed on the first insulating film;
a first metal layer disposed on and electrically connected to the first plug, and wherein the first metal layer is formed in the substrate; and
a second metal layer including (i) a first portion provided in the substrate and (ii) a second portion disposed on the substrate and electrically connected to the first metal layer,
wherein the first plug is made of a first metal material, and
the first metal layer is made of a second metal material different from the first metal material.

10. The semiconductor device according to claim 9, further comprising a second insulating film provided on an upper surface and a side surface of the substrate, wherein
the first portion is disposed in the substrate and the second insulating film, and
the second portion is disposed on the substrate and the second insulating film.

11. A method of manufacturing a semiconductor device comprising:
providing a first substrate and a second substrate;
forming a first metal layer in the second substrate;
forming a first plug on the first metal layer;
adhering the first substrate to the second substrate via the first plug and the first metal layer;
forming a first opening in the second substrate to expose the first metal layer; and
forming a second metal layer in the first opening, the second metal layer being electrically connected to the first plug.

12. The method according to claim 11, wherein the forming the first opening includes using a gas containing a fluorine (F) element.

13. The method according to claim 11, wherein
the first plug contains a first metal element, and
the first metal layer contains a second metal element different from the first metal element.

14. The method according to claim 13, wherein
the first metal element is a tungsten (W) element, and
the second metal element is at least one of an aluminum (Al) element, a hafnium (Hf) element, or a zirconium (Zr) element.

15. The method according to claim 11, wherein the forming the first metal layer includes injecting metal atoms into the second substrate.

16. The method according to claim 11, wherein the forming the first metal layer includes forming a recess portion in the second substrate and burying the first metal layer in the recess portion.

17. The method according to claim 11,
wherein the forming the first metal layer includes:
forming a first insulating film on the second substrate,
exposing the second substrate by forming a second opening in the first insulating film,
forming the first metal layer in the second opening, and
wherein the first plug is formed in the second opening.

18. The method according to claim 11, wherein the forming the first metal layer includes:
forming the first metal layer in the second substrate,
forming a first insulating film on the second substrate and the first metal layer,
exposing the first metal layer by forming a second opening in the first insulating film, and
wherein the first plug is formed on the first metal layer exposed in the second opening.

19. The method according to claim 11, wherein the second metal layer is directly electrically connected to the first plug or the second metal layer is electrically connected to the first plug via the first metal layer.

20. The method according to claim 11, wherein the first opening is formed by using a gas containing an oxygen (O) element.

* * * * *